United States Patent [19]
Hong et al.

[11] Patent Number: 6,099,242
[45] Date of Patent: Aug. 8, 2000

[54] WAFER ALIGNING APPARATUS FOR SEMICONDUCTOR DEVICE FABRICATION

[75] Inventors: Hyung-sik Hong; Sung-soo An, both of Kyungki-do, Rep. of Korea

[73] Assignee: Samsung Electronics Co., Ltd., Suwon, Rep. of Korea

[21] Appl. No.: 09/130,512

[22] Filed: Aug. 7, 1998

[30] Foreign Application Priority Data

Dec. 8, 1997 [KR]  Rep. of Korea ............ 97-66718

[51] Int. Cl.⁷ ............................................. B65G 65/00
[52] U.S. Cl. ............................................. 414/940
[58] Field of Search .................... 118/715, 729, 118/730, 728; 156/345; 414/938, 940, 788.6

[56] References Cited

U.S. PATENT DOCUMENTS

| | | | |
|---|---|---|---|
| 5,620,295 | 4/1997 | Nishi | 414/417 |
| 5,845,660 | 12/1998 | Shindo et al. | 134/56 R |
| 5,895,191 | 4/1999 | Bonora et al. | 414/217 |
| 5,940,985 | 8/1999 | Kamikawa et al. | 34/471 |

*Primary Examiner*—Richard Bueker
*Assistant Examiner*—Erin Fieler
*Attorney, Agent, or Firm*—Jones Volentine, LLP

[57] ABSTRACT

A wafer aligning apparatus for semiconductor device fabrication includes a cassette support on which is mounted a cassette holding wafers immersed in a non-conducting fluid. A guide roller is composed of carbon fiber reinforced polyether and rotates in contact with circumferential edges of the wafers. A wafer support holds the wafers apart from the roller when flat zones of the wafers are aligned with the wafer support

7 Claims, 2 Drawing Sheets

WAFER ALIGNING APPARATUS FOR SEMICONDUCTOR DEVICE FABRICATION

BACKGROUND OF THE INVENTION

1. Field of the Invention

The present invention relates to a wafer aligning apparatus for semiconductor device fabrication, and more particularly, to a wafer aligning apparatus having an anti-static guide roller.

2. Description of the Related Art

Generally, semiconductor devices are manufactured by repeatedly carrying out various kinds of processes such as photolithography, diffusion, etching, ion-implantation and metallization on semiconductor wafers. In order to carry out these processes, the wafers are placed in various kinds of equipment, each designed for a certain processing step.

When the wafers are inserted in such equipment, the wafers often must be aligned according to a certain specific direction because of crystal orientations in the wafer. Production problems can occur if an orientation dependent process is performed on wafers which are not aligned. When the wafers are misaligned in such a process, the process may not be performed accurately, thereby the yield of semiconductor devices produced by the equipment is decreased, and in some cases subsequent processing of the semiconductor device must be discontinued.

Conventional wafer aligning apparatus make use of the flat zone formed on one part of the perimeter of the wafer which is otherwise circular. The flat zone is formed by cutting the edge of a circular wafer (or one side of a cylindrical ingot from which individual wafers are subsequently sliced) along a straight line in a direction that designates one of the standard crystal directions. The conventional apparatus aligns wafers for a certain process by aligning the flat zones of all the wafers in a cassette of wafers undergoing that process.

The conventional wafer aligning apparatus includes a guide roller which contacts the circular edges of the wafers in the cassette with sufficient friction to rotate the wafers. But since the flat zones do not extend as far from the center of the circular portion of the wafer edge, the middles of the flat zones do not contact the guide roller with sufficient friction to rotate the wafers. The wafers are aligned when the guide roller no longer rotates the wafers.

Typically the roller is located below the wafers in the cassette so that gravity helps to maintain frictional contact between the circular, i.e. circumferential, edges of the wafers and the guide roller. In addition, a wafer support placed at the same height as the guide roller holds the flat zones of the wafers out of contact with the guide roller. As a result, all the wafers inside the cassette are aligned with the flat zones along the downward direction within a specific time after the guide roller begins rotating.

However, the conventional wafer aligning apparatus has a problem with static electricity. The conventional guide roller has a shaft that is made of metal, and a roller coat that encloses the shaft and is made of nonconducting synthetic resins, such as rubber or TEFLON. The friction between the wafers and the coat of the guide roller generates static electricity charges that accumulate on the surface of the nonconducting roller coat and on the wafers. If the wafers are immersed in a nonconducting fluid, such as air, the accumulated charges remain on the surfaces of the wafers and roller. Particles around the apparatus with slight charges of opposite sign are attracted to and are also accumulated on the charged wafers and guide roller. These particles contaminate the wafers. In addition, the particles cause corrosion damage on the wafer surface when the accumulated static electricity is suddenly discharged after building to a sufficiently large voltage.

Furthermore, the rubber-made guide roller surface is easily worn down by the friction with the wafers, and produces additional particles that contaminate the wafers.

Since, these friction and the discharge problems have not been solved, there is a need to prevent the generation of static electricity on the guide roller, or to prevent the accumulation of the static electricity and the attracted particles.

SUMMARY OF THE INVENTION

The present invention is directed to a wafer aligning apparatus having a guide roller that can discharge the generated static electricity, which substantially overcomes one or more of the problems due to the limitations and the disadvantages of the related art.

To achieve this and other objects and advantages of the present invention, the wafer aligning apparatus for semiconductor device fabrication includes a cassette support on which is mounted a cassette holding wafers immersed in a substantially non-conducting fluid. A guide roller composed of carbon fiber reinforced polyether rotates in contact with circumferential edges of the wafers. A wafer support holds the wafers apart from the roller when flat zones of the wafers are aligned with the wafer support.

It is understood that both the foregoing general description and the following detailed description are exemplary and explanatory and are not limiting. The invention is broader than these descriptions and is intended to encompass all embodiments that fall within the scope of the appended claims and their equivalents.

DETAILED DESCRIPTION OF THE PREFERRED EMBODIMENTS

Reference will now be made in detail to the preferred embodiment of the present invention, examples of which are illustrated in the accompanying drawings.

Figure 1:
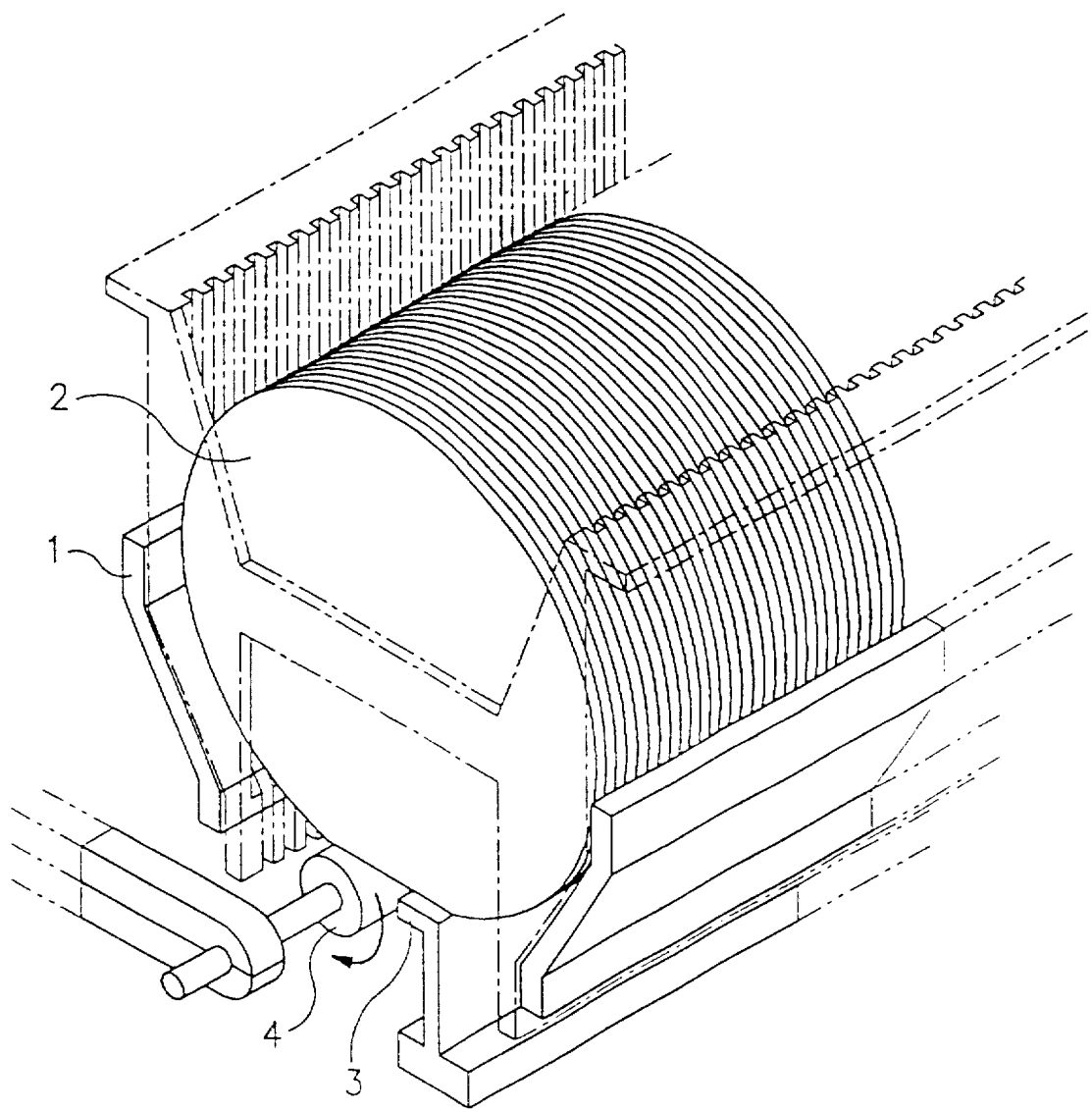
FIG. 1 is a perspective view showing the wafer aligning apparatus for semiconductor device fabrication according to the present invention.

As shown in FIG. 1, the wafer aligning apparatus for semiconductor device fabrication includes a cassette support 1 on which a cassette for wafers 2 is mounted. An anti-static guide roller 4, that rotates in frictional contact with the arcuate circumferential edges of the wafers 2 inside the cassette, is made of carbon fiber-reinforced polyether. A wafer support 3 holds the aligned wafers 2, after rotation, away from frictional contact with the guide roller 4.

The carbon fiber of the carbon fiber reinforced polyether is preferably about 10 micrometers (μm) to about 20 μm long, having diameters from about 7 μm to about 9 μm, and constituting about 10 to about 20 percent by weight of the polyether.

The polyether contains an ether (—C=O—) linkage among the back bone of the polymer. It is normally formed by the reaction of aldehyde and epoxide or similar functional group. The polymer is widely used for various kinds of chemical devices, or containers and valves for chemical materials because of its good chemical-resistance and mechanical characteristics. In the preferred embodiment, the polyether is polyetheretherketone.

The carbon fiber in the polyether functions to reinforce the mechanical characteristics of the polyether of the guide roller 4, and also, because it provides some enhanced electrical conductivity, i.e. lowered electrical resistivity, it functions to prevent static electricity from being accumulated. That is, since the carbon fiber itself has good electrical conductivity, it allows the generated static electricity to flow away from the wafers and roller surface before a large charge accumulates on the wafers or roller surface.

Though experimentation it was determined that if the amount of the carbon fiber in the polyether is above 20% by weight, the physical properties of the polyether are degraded. If the amount of the carbon fiber in the polyether is less than 5% by weight, the discharge of the static electricity is not sufficient.

According to the present invention, carbon fiber is added to the polyether such that the surface resistivity of the polyether is decreased to about $10^{-5}$ to $10^{-9}$ Ohms per square centimeter ($\Omega/cm^2$). As a result, the flow of the static electricity charge away from the wafer is allowed with the passage of time at a faster rate. The resistivity is chosen so that the static electricity lasts on the surface for a static decay time less time than the time the roller is operated, and the accumulation of excessive charge on the wafers during alignment is prevented. Therefore, the particles attracted due to the accumulation of static electricity and the surface corrosion of the wafers due to the discharge of the static electricity are both prevented.

The static decay time is 0.01 to 1 seconds when using material having $10^{-5}$ to $10^{-9} \Omega/cm^2$ of surface resistivity for the guide roller 4. With this static decay time, static electricity is not accumulated excessively on the surface of the roller during roller operation and is discharged smoothly when the frictional contact between of the roller and wafer is substantially ended.

Figure 2:
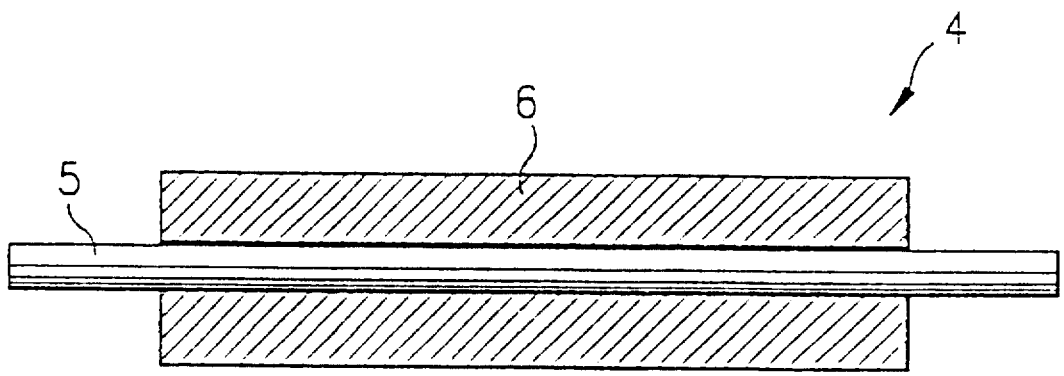
FIG. 2 is a sectional view schematically showing the guide roller used in the wafer aligning apparatus of the FIG. 1 according to one embodiment of the present invention.
Figure 3:
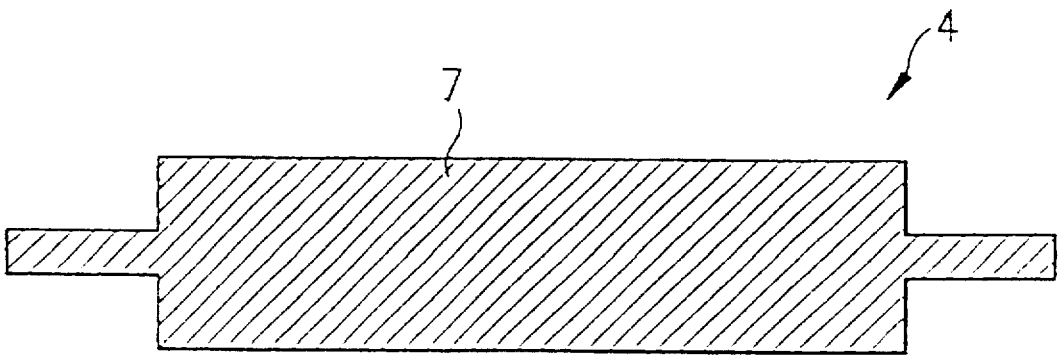
FIG. 3 is a sectional view schematically showing the guide roller used in the wafer aligning apparatus of the FIG. 1 according to another embodiment of the present invention.

The guide roller 4 illustrated in FIG. 2 has a structure in which a shaft 5 of metallic material is concentrically disposed within a roller coat 6 of carbon fiber reinforced polyether. Or, as shown in FIG. 3, the guide roller 4 can be constructed as an integral roller in which the shaft and the roller coat form one body 7 of the same material. In this embodiment, the shaft has two parts, one on either end of the guide roller 4. In either embodiment, because the surface of the guide roller 4 coat that rotates in contact with the wafer 2 is made of carbon fiber reinforced polyether, static electricity which can be generated by friction during the rotation is discharged by the carbon fiber. As a result, the accumulation of the static electricity charges on the surfaces of the wafers 2 and the guide roller 4 is prevented.

Furthermore, polyetheretherketone including carbon fiber is very stable thermally. It undergoes heat-transformation at a temperature of 310° C. under a pressure of 18.6 kilogram-force per square centimeter ($kgf/cm^2$), and its melting point is 344° C. In addition carbon fiber reinforced polyetheretherketone is very stable chemically. It does not react with the methylethylketone group such as acetone, widely-used as organic solvents, or with the nitryl group such as acetonitryl. It does not react with the halogenide group such as dichloromethane, or the alcohol group such as isopropyl alcohol, or the hydrogen carbide group such as isooctane, or the ether group such as tetrahydrofuran. Therefore, carbon fiber reinforced polyetheretherketone is relatively stable under any of the processing conditions usually found in semiconductor device fabrication.

As described above, according to the present invention, both the accumulation of particles attracted by static charges and also the surface corrosion of wafer caused by the sudden discharge of accumulated static charges are prevented. Therefore, the yield of semiconductor devices is increased and productivity is improved by employing the guide roller of the present invention having a low surface resistivity.

While the present invention has been described in detail in the above embodiments, it should be understood that various changes, substitutions and alterations can be made hereto by those of ordinary skill in the art without departing from the spirit and scope of the invention as defined by the appended claims and their equivalents.

What is claimed is:

1. A wafer aligning apparatus for semiconductor device fabrication comprising:

a wafer cassette configured to receive a plurality of wafers therein, said cassette having an opening at which circumferential edges of the wafers received therein are exposed;

a cassette support supporting said wafer cassette;

a rotary guide roller extending axially along said opening of the cassette at a position in which the guide roller will contact arcuate circumferential edges of wafers received in said cassette, the guide roller being supported in the apparatus so as to be rotatable about its longitudinal axis, rotation of the guide roller rotating wafers received in said cassette due to friction between the arcuate circumferential edges of the wafers and the guide roller, and the guide roller being composed of carbon fiber reinforced polyether, the carbon fiber being provided in an amount sufficient to conduct away static charges created as the result of the friction between the guide roller and wafers being aligned by the guide roller; and a wafer support disposed at a position in which the wafer support will contact and support flat zones of the wafers once the flat zones confront the guide roller as the result of rotation of the wafers by the guide roller.

2. The wafer aligning apparatus of claim 1, wherein the polyether is polyetheretherketone.

3. The wafer aligning apparatus of claim 1, wherein the polyether includes carbon fiber contributing a percentage by weight in the range from about 10% to about 20%.

4. The wafer aligning apparatus of claim 3, wherein the carbon fibers have lengths in the range from 10 μm to about 20 μm and diameters in the range from about 7 μm to about 9 μm.

5. The wafer aligning apparatus of claim 3, wherein the carbon fiber reinforced polyether has surface resistivity in the range from about $10^{-5} \Omega/cm^2$ to about $10^{-9} \Omega/cm^2$.

6. The wafer aligning apparatus of claim 1, the guide roller further comprising a metal shaft concentrically disposed within a carbon fiber reinforced polyether coat.

7. The wafer aligning apparatus of claim 1, the guide roller further comprising integral shaft ends concentrically disposed on respective ends of the roller.

* * * * *